United States Patent [19]

Rukavina et al.

[11] Patent Number: 5,471,554

[45] Date of Patent: Nov. 28, 1995

[54] PRIMER FOR ELECTROCHROMIC DEVICE WITH PLASTIC SUBSTRATE

[75] Inventors: Thomas G. Rukavina, Lower Burrell; John B. Slobodnik, New Kensington, both of Pa.

[73] Assignee: PPG Industries, Inc., Pittsburgh, Pa.

[21] Appl. No.: 152,337

[22] Filed: Nov. 12, 1993

[51] Int. Cl.$^6$ .............................. G02B 6/138; G02F 1/17
[52] U.S. Cl. ..................... 385/131; 385/141; 385/143; 385/147; 359/265; 359/267; 359/275
[58] Field of Search ..................... 359/265, 267, 359/269, 270, 273, 274, 275; 385/131, 130, 129, 141, 143, 145, 147

[56] References Cited

U.S. PATENT DOCUMENTS

| | | | |
|---|---|---|---|
| 3,892,472 | 7/1975 | Giglia | 359/275 X |
| 4,170,406 | 10/1979 | Giglia et al. | 359/275 X |
| 4,174,152 | 11/1979 | Giglia et al. | 359/265 X |
| 4,194,812 | 3/1980 | Hara et al. | 359/267 X |
| 4,335,938 | 6/1982 | Giglia et al. | 359/265 X |
| 4,350,414 | 9/1982 | Takahashi et al. | 359/265 X |
| 4,361,385 | 11/1982 | Huang et al. | 359/265 X |
| 4,478,991 | 10/1984 | Huang et al. | 526/287 |
| 4,550,982 | 11/1985 | Hirai | 359/374 X |
| 4,554,318 | 11/1985 | Rukavina | 525/118 |
| 4,573,768 | 3/1986 | Polak et al. | 359/374 X |
| 4,609,703 | 9/1986 | Rukavina | 524/360 |
| 4,652,090 | 3/1987 | Uchikawa et al. | 359/265 X |
| 4,670,350 | 6/1987 | Rukavina | 428/520 |
| 4,842,383 | 6/1989 | Yang et al. | 359/265 X |
| 5,011,582 | 4/1991 | Oshikawa et al. | 204/140 |
| 5,124,080 | 6/1992 | Shabrang et al. | 252/583 |
| 5,124,832 | 6/1992 | Greenberg et al. | 359/275 X |
| 5,142,406 | 8/1992 | Lampert et al. | 359/269 X |
| 5,377,039 | 12/1994 | Babinec | 359/265 |

FOREIGN PATENT DOCUMENTS

| | | | |
|---|---|---|---|
| 0098416 | 12/1992 | European Pat. Off. | 359/265 X |
| 3-42634 | 2/1991 | Japan | 359/265 X |
| 4-107427 | 4/1992 | Japan . | |
| 4-306614 | 10/1992 | Japan | 359/265 X |
| 4-318525 | 11/1992 | Japan | 359/265 X |

OTHER PUBLICATIONS

Cogan et al., *SPIE*, vol. 823, No. 482 (1987), "The a–WO$_3$/a–IrO$_2$ Electrochromic System" No month.

Kang et al., *J. Electrochem Soc.*, vol. 130, No. 4, p. 766 et sq. (Apr. 1983), "Blue Sputtered Iridium Oxide Films (Blue SIROF's)".

Rauh et al., *Solid State Ionics*, 28–30 (1988) pp. 1707–1714, "Counter Electrodes in Transmissive Electrochromic Light Modulators" No month.

Hackwood et al., *Journal of the Electrochemical Soc.*, vol. 128, No. 6, pp. 1212 1214, (Jun. 1981), "Volume Changes Induced by the Electrochromic Process in Sputtered Iridium Oxide Films".

*Primary Examiner*—Brian Healy
*Attorney, Agent, or Firm*—Donna L. Seidel; Irwin M. Stein

[57] ABSTRACT

Novel acrylic acid copolymer primer compositions are disclosed for bonding electroconductive metal oxide films to plastic substrates for electrochromic articles.

10 Claims, 1 Drawing Sheet

PRIMER FOR ELECTROCHROMIC DEVICE WITH PLASTIC SUBSTRATE

BACKGROUND OF THE INVENTION

This invention relates generally to the art of electrochromic cells, and more particularly to the art of transparent electrochromic devices comprising plastic substrates, most particularly to the art of bonding electroconductive metal oxide films to plastic substrates.

Conventional electrochromic cells comprise a thin film of a persistent electrochromic material, i.e. a material responsive to the application of an electric field of a given polarity to change from a high-transmittance, non-absorbing state to a lower-transmittance, absorbing or reflecting state and remaining in the lower-transmittance state after the electric field is discontinued, preferably until an electric field of reversed polarity is applied to return the material to the high-transmittance state. The electrochromic film, which is both an ionic and electronic conductor, is in ion-conductive contact, preferably direct physical contact, with a layer of ion-conductive material. The ion-conductive material may be solid, liquid or gel, but is preferably a polymer layer. The electrochromic film and ion-conductive layers are disposed between two electrodes.

As a voltage is applied across the two electrodes, ions are conducted through the ion-conducting layer. When the electrode adjacent to the electrochromic film is the cathode, application of an electric field causes darkening of the film. Reversing the polarity causes reversal of the electrochromic properties, and the film reverts to its high transmittance state. Typically, the electrochromic film, preferably tungsten oxide, is deposited on a glass substrate coated with an electroconductive film such as tin oxide to form one electrode. The counter electrode has typically been a carbon-paper structure backed by a similar tin oxide coated glass substrate or a metal plate.

U.S. Pat. No. 4,174,152 to Giglia et al. discloses electrochromic devices wherein the polymeric electrolyte material is a hydrophilic copolymer of a selected acrylate or methacrylate monomer and a selected acid group containing monomer, e.g. 2-acrylamido-2-methylpropanesulfonic acid.

U.S. Pat. No. 4,335,938 to Giglia discloses electrochromic devices having a layer of tungsten oxide in contact with a layer of organic electrolyte resin comprising a hydrophilic layer of homopolymer of poly(2-acrylamido-2-methylpropanesulfonic acid) with electrode means for changing electrochromic properties of the device. A conventional electrochromic device is described as having a transparent electrochromic electrode comprising a glass substrate with a conductive tin oxide layer and an electrochromic, e.g. tungsten oxide, film; a pigmented, ion-conducting medium layer comprising a self-supporting layer of ion-conductive polymer having a pigment dispersed therein; and an opaque counter electrode such as carbon paper.

U.S. Pat. Nos. 4,361,385 and 4,478,991 to Huang et al. disclose electrochromic devices having a layer of electrochromic tungsten oxide in contact with a polymeric electrolyte wherein the stability and speed of the device are improved by using a copolymer of 2-acrylamido-2-methylpropanesulfonic acid and vinyl sulfonic acid as the polymer electrolyte. An electrochromic film on an electrode is prepared by evaporation of an amorphous film of tungsten oxide onto a glass substrate coated with conductive tin oxide. The polymer mixture is cast, dried and hydrated in contact with the electrochromic film, and then a second electrode consisting of paper-carbon is pressed against the polymer layer with a second tin oxide coated glass plate backing the carbon-paper electrode.

U.S. Pat. Nos. 4,554,319; 4,609,703 and 4,670,350 to Rukavina disclose novel copolymers of acrylic acid and cyanoethylacrylate, including terpolymers with hydroxyethylacrylate, useful as primers for bonding metal-containing coatings to organic polymer substrates.

SUMMARY OF THE INVENTION

The present invention comprises novel primer compositions to bond an electroconductive film to a surface of a polymeric substrate, particularly for an electrochromic article further comprising an electrochromic film, an ion-conductive layer, a complementary electrochromic film, and a second polymeric substrate, also bearing the primer of the present invention which bonds an electroconductive film to a surface thereof. The present invention provides primers comprising copolymers of acrylic acid and substituted acrylates such as methyl methacrylate, which promote adhesion of electroconductive metal oxide films on polymer substrates, and which also enable the electroconductive films to resist cracking under high humidity conditions and thermal gradients.

DESCRIPTION OF THE INVENTION

Figure 1:
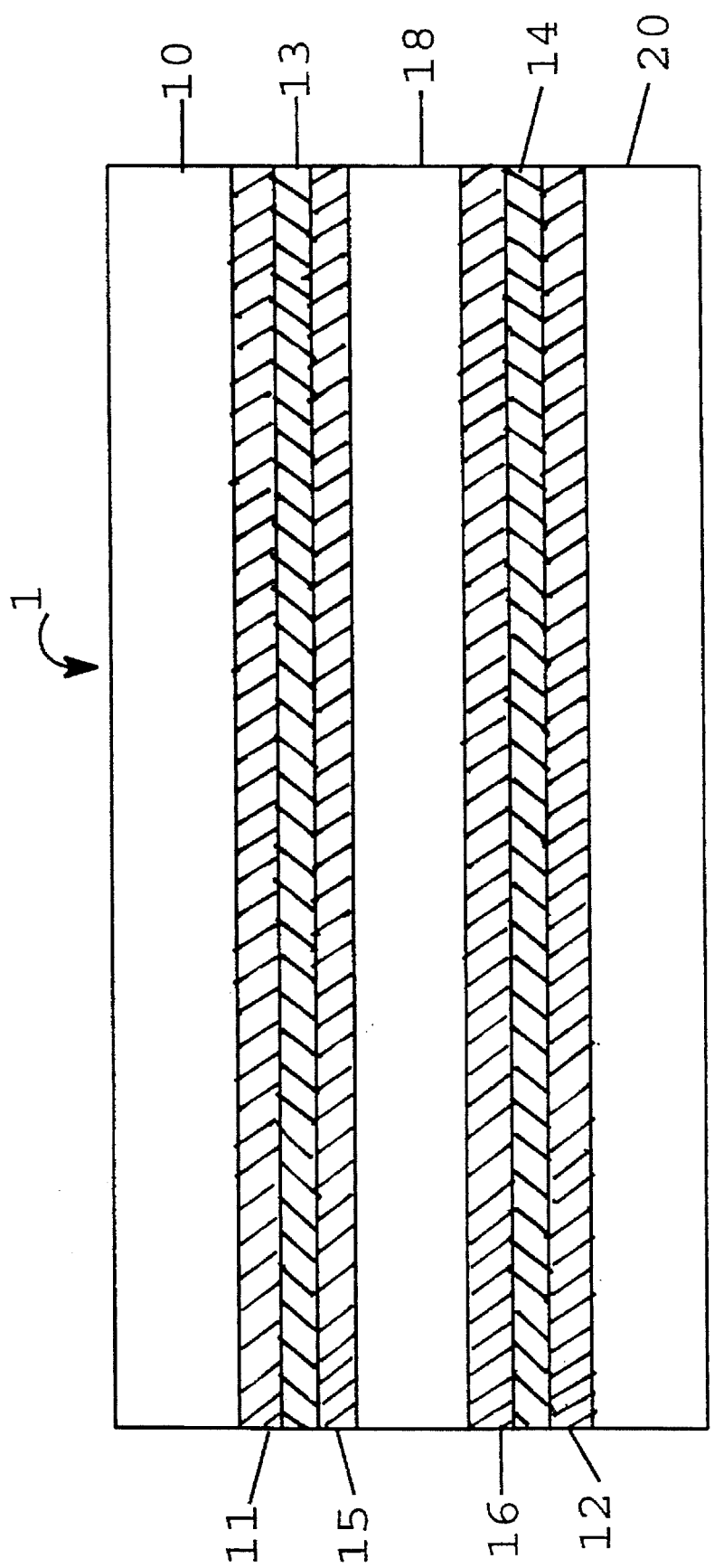
FIG. 1 is a vertical cross-sectional view of an electrochromic device incorporating the novel primer compositions of the present invention. Cross-hatching is used to differentiate the various layers only and not to represent any material of construction; nor is the width of an illustrated layer in the figure indicated by the thickness of such layer.

Referring to FIG. 1, there is shown an electrochromic device 1 comprising polymeric substrates 10 and 20. On one surface of substrate 10 is disposed primer layer 11 on which an electroconductive film 13 is deposited. Film 13 has deposited on its surface electrochromic layer 15. Similarly, polymeric substrate 20 has a coating of primer layer 12 on which is deposited electroconductive film 14. Electroconductive film 14 has deposited on its surface complementary electrochromic layer 16. The two halves of the electrochromic device 1 are joined by ion-conductive polymer electrolyte 18 to form a laminated article.

DESCRIPTION OF PREFERRED EMBODIMENTS

The polymeric substrate primed with the compositions of the present invention is preferably a transparent material suitable for forming lenses which may be used in eyewear. The polymeric substrate may be a low refractive index (about 1.5) material, a relatively high (about 1.6) refractive index material, or a mid-range (about 1.55) refractive index material, depending on the end use. Polycarbonate and polyacrylate substrates may be used. A preferred low index material for lenses is a polymer prepared from diethylene glycol bis(allylcarbonate), specifically a polymer prepared from CR-39® monomer, a product of PPG Industries, Inc. For eyewear, each lens preferably is no more than about 1 millimeter thick so that the electrochromic laminated article has a total thickness not more than about 2.1 to 2.2 millimeters.

The electroconductive film is preferably a transparent thin film of metal or metal oxide, preferably, tin oxide, fluorine-doped tin oxide or tin-doped indium oxide, commonly referred to as ITO (indium/tin oxide), preferably comprising a weight ratio of about 90:10 indium and tin. The film thickness is preferably in the range of 2000 to 4000 Angstroms for acceptable conductivity. The electroconductive film may be deposited by a variety of methods so long as the polymeric substrate is not deleteriously affected. High temperature pyrolyric methods typically used to deposit electroconductive films on glass are not suitable for plastic substrates. A preferred method of depositing ITO on plastic is direct current sputtering, particularly magnetron sputtering (MSVD). However, the adhesion of MSVD electroconductive metal oxide films to plastic substrates is not generally adequate for electrochromic devices of the present invention.

The primer of the present invention is disposed at the interface of the plastic substrate and electroconductive film to provide adequate adhesion of the electroconductive film to the plastic substrate, as well as to prevent crazing and/or cracking of the plastic or the electroconductive film. The primer of the present invention is an acrylate copolymer, preferably a copolymer of acrylic acid and a substituted acrylate such as cyanoethylacrylate, hydroxyethylacrylate or methyl methacrylate. Preferably, the substituted acrylate is methyl methacrylate, and the molar ratio of acrylic acid to methyl methacrylate is from about 3 to 1 to 1 to 3. The primer composition preferably comprises a free radical initiator such as azobis(isobutyronitrile). The primer is preferably applied to the substrate surface as a solution in organic solvent by dip, spin, spray, flow or other conventional application technique. The organic solvent is then evaporated and the primer cured at slightly elevated temperature. The solvent may be 1-butanol, cyclohexanone, acetone, or mixtures of such solvents, and is preferably 1-butanol and/or 1-propanol. The solution preferably includes a curing catalyst, such as dibutyltindilaurate (DBTDL) or uranyl nitrate. A preferred method of applying the primer is to dip a plastic lens into a primer solution, dry, cure, and subsequently polish the primer off the surface not coated with electroconductive film. The thickness of the primer is preferably in the range of about 0.01 to 0.50 microns, more preferably about 0.29 to 0.46 microns for optimum adhesion. The linear polymer is preferably crosslinked with cycloaliphatic diepoxides such as 2-[3,4-epoxy cyclohexyl-5,5-spiro-3,4-epoxy] cyclohexane-meta-dioxane; bis[3,4-epoxycyclohexyl] adipate; and 3,4-epoxy-cyclohexyl-3,4-epoxy-cyclohexane-carboxylate.

Two primed and electroconductive film coated plastic lenses are paired to form an electrochromic device in accordance with the present invention. One of the pair is further coated, over the electroconductive film, with a layer of electrochromic material. Of the various known electrochromic materials, tungsten oxide is preferred. The tungsten oxide may be deposited by thermal evaporation of tungsten oxide, but is preferably deposited by direct current (dc) magnetron sputtering of tungsten in an oxidizing atmosphere. The thickness of the tungsten oxide film is preferably in the range of 3000 to 5000 Angstroms. The tungsten oxide is in the clear state as deposited.

The other lens is preferably further coated, over the electroconductive film, with a layer of complementary electrochromic material. Of the various known complementary electrochromic materials, iridium oxide is preferred. The substrate to be coated with iridium oxide is electrochemically reduced, so that the iridium oxide as deposited is in a reduced state. The iridium oxide is preferably deposited by radio frequency (rf) magnetron sputtering. The thickness of the iridium oxide film is preferably in the range of 300 to 800 Angstroms.

After the two substrates have been primed, electroconductive film coated and electrochromic film coated, the pair are assembled to form a cell. Between the coated surfaces is disposed a layer of polymer which bonds with both surfaces to form a laminated article. The polymer is preferably an ion-conductive polymer electrolyte. In accordance with the present invention, the polymer electrolyte is preferably a proton-conducting polymer. Homopolymers of 2-acrylamido-2-methylpropanesulfonic acid (AMPS® - a registered trademark of Lubrizol) and copolymers of AMPS with various monomers may be utilized in the form of preformed sheets which are laminated between the substrates, or in the form of liquid reaction mixtures which are cast and cured in place. A preferred proton-conducting polymer electrolyte in accordance with the present invention, is a copolymer of AMPS and N,N-dimethylacrylamide (DMA), preferably cast and cured in place. The thickness of the polymer electrolyte is preferably in the range of 0.001 to 0.025 inch (0.0254 to 0.625 millimeter), more preferably 0.005 to 0.015 inch (0.127 to 0.381 millimeter).

The AMPS/DMA copolymer proton-conductive electrolyte is preferably cast in place as a solution of monomers in 1-methyl-2-pyrrolidinone (NMP) and water. The solution preferably comprises an initiator to polymerize the monomers upon exposure to actinic radiation, preferably ultraviolet (UV) light. Preferred UV initiators include benzoin methyl ether and diethoxyacetophenone. The monomer solution may be poured between two electroconductive and electrochromic coated polymer substrates assembled together with a 0.015 to 0.02 inch (0.381 to 0.508 millimeter) Teflon® spacer held in place with commercially available sealant, e.g. Torr Seal® from Varian Vacuum Products. For a pair of lens substrates, the monomer solution may be poured onto the concave surface of one lens and the convex surface of the other lens may be placed over the monomer solution, thus forming the monomer solution into a thin film. Exposure to UV light sufficient to cure the polymer electrolyte is typically about 30 minutes for a mercury lamp and about 1 to 3 minutes for a xenon lamp. UV inhibitors to protect the polymer from long term exposure to solar radiation may be used if the polymer contains appropriate UV initiators for curing upon exposure to long wavelength UV radiation.

The resultant electrochromic lens is generally crack-free with insignificant haze (0.3 to 0.4%). The electrical connections to the electrochromic device are preferably made with electronic conductive bus bars. The optical transmittance at 550 nanometers is typically about 75 percent in the bleached state and a minimum of about 3 percent in the darkened state in the voltage range of from about +1.5 to −1.5 volts for a charge in the range of about 23 to 29 millicoulombs per square centimeter ($mC/cm^2$).

The present invention will be further understood from the descriptions of specific examples which follow:

EXAMPLE I

A solution of 1 mole of hydroxyethylacrylate, 1 mole acrylic acid, and 1 mole of 2-cyanoethylacrylate was prepared in cyclohexanone solvent at a 25 percent solids concentration. To this solution was added 0.05 percent azobisisobutyronitrile by weight of the monomers. The solution was sparged with nitrogen for 15 minutes and the reaction mixture heated to 90° C. for 24 hours under inert atmosphere. The oligomer solution was then diluted to a 10 percent solids solution. To this solution was added a stoichiometric amount of 2-[3,4-epoxy cyclohexyl-5,5-spiro-3,4-epoxy] cyclohexane-metadioxane to react all of the carboxylic acid groups and the hydroxyl moieties derived from hydroxyethylacrylate. A surfactant (FC-430 from 3M) was added at 0.05 percent by weight of the solution along with 0.1 percent of dibutyltin dilaurate catalyst for the cycloaliphatic epoxy/hydroxyl/carboxylic acid reaction. Two 70 millimeter diameter, 2 millimeter thick 6 base plano lens substrate of polymer based on CR-39® monomer (PPG Industries, Inc.) was dip-coated in the above solution. The solvent was evaporated and the film cured at 180° F. (about 82° C.) for 8 hours to form a terpolymer primer layer.

An electroconductive coating of indium/tin oxide (ITO) was then deposited onto one surface of these substrates by direct current (dc) magnetron sputtering at a temperature of 140° F. (60° C.). The thickness of the indium/tin oxide (ITO) layer was about 2600 Angstroms.

The electrochromic materials, tungsten oxide and iridium oxide, were separately vacuum deposited onto the electroconductive primed substrates by thermal evaporation and radio frequency (rf) sputtering techniques respectively. The deposition conditions for thermal evaporation of tungsten oxide included a base pressure of $5 \times 10^{-5}$ Torr. A voltage of 1.1 kilovolts (kV) was then applied to the evaporation boat of tungsten oxide for fifteen minutes; the deposition rate was 7 nanometers per second (nm/sec). The terminating thickness was 3700±500 Angstroms. A glow discharge consisting of an argon gas plasma was then applied to the surface of the tungsten oxide film for fifteen minutes. The plasma exposure was found to improve the adhesion of the electrochromic film to the ion conducting polymer electrolyte.

Sputtering of iridium oxide was performed using an iridium target 2.87 inches (7.29 centimeters) in diameter with the distance to the substrate being six inches (15.24 centimeters). The base pressure of the chamber was $2.5 \times 10^{-5}$ Torr. The gas composition was 100 percent oxygen, with a pressure of $2 \times 10^{-3}$ Torr. The rf power was 75 watts (W) for a duration of eight minutes. The resulting thickness was approximately 400 Angstroms. Again, a glow discharge consisting of an argon gas plasma was applied to the surface of the iridium oxide film for fifteen minutes.

Following the vacuum depositions of the above layers, the $WO_3$/ITO/primer/polymer substrate was electrochemically charged in 0.1 normal hydrochloric acid (HCl); the accumulated charge was approximately 23 millicoulombs per square centimeter ($mC/cm^2$). The electrochemical pre-conditioning was accomplished under galvanostatic conditions, where the applied current was $1.5 \times 10^{-3}$ amps. The iridium oxide/ITO/primer/polymer lens was not electrochemically treated.

The two lenses were assembled with their coated surfaces in facing relationship, spaced 0.020 inch (0.508 millimeter) apart by means of a Teflon® spacer. A solution comprising 2-acrylamido-2-methylpropane-sulfonic acid (AMPS®) and N,N-dimethylacrylamide (DMA) in 1-methyl-2-pyrrolidinone (NMP) and water, with diethoxyacetophenone UV initiator was cast into the cavity and polymerized by means of exposure to ultraviolet light for 30 minutes.

Electrical connections to the electrochromic lens were made with copper tape and were insulated with Teflon® tape. The electrochromic lens darkened to 18 percent transmittance upon application of +1.2 volts for 2 minutes and completely bleached to 58 percent transmittance upon application of −0.5 volts for 1.5 minutes.

EXAMPLE II

A cyanoethylacrylate/acrylic acid copolymer (mole ratio 0.5) was prepared via free radical polymerization using a 25 percent by weight monomer solution in a solvent mixture of 50/50 cyclohexanone/acetone. Azobisisobutyronitrile was used as the initiator at a concentration of 0.05 percent by weight of the solution. The reaction was sparged with nitrogen for 15 minutes and the reaction mixture heated to 90° C. for 24 hours under inert atmosphere. The solution was then diluted to 10 percent solids using the same solvent. To this solution was added a stoichiometric amount of 2-[3,4-epoxy cyclohexyl-5,5-spiro-3,4-epoxy] cyclohexane-metadioxane to react all of the carboxylic acid groups. A surfactant (FC-430 from 3M) was added at 0.05 percent by weight of the solution along with 0.1 percent of dibutyltin dilaurate catalyst for the cycloaliphatic epoxy/hydroxyl/carboxylic acid reaction. The solution was diluted to 10 percent solids with 50/50 cyclohexanone/acetone. The solution was applied to a polymer substrate formed from CR-39® monomer, and cured for 8 hours at 200° F. (93° C.).

EXAMPLE III

A copolymer of 1 mole of methyl methacrylate and 3 moles of acrylic acid was prepared in 1-butanol at 25 percent by weight monomer concentration. Azobisisobutyronitrile was used as the initiator at a concentration of 0.05 percent by weight of solution. The reaction was sparged with nitrogen for 15 minutes and the reaction mixture heated to 90° C. for 24 hours under inert atmosphere. The solution was then diluted to 10 percent solids using the same solvent. To this solution was added a stoichiometric amount of 2-[3,4-epoxy cyclohexyl-5,5-spiro-3,4-epoxy] cyclohexane-metadioxane to react all of the carboxylic acid groups. A surfactant (FC-430 from 3M) was added at 0.05 percent by weight of the solution along with 0.1 percent by weight of dibutyltin dilaurate catalyst for the cycloaliphatic epoxy/carboxylic acid reaction. The solution was diluted to 10 percent solids with 50/50 cyclohexanone/acetone. The solution was applied to a polymer substrate formed from CR-39® monomer, and cured for 8 hours at 180° F. (82° C.).

The above examples are offered to illustrate the present invention without limiting its scope, the scope of which is defined by the following claims. Various other materials and process conditions may be used. For example, while the examples utilize ITO as an electroconductive film, other materials such as fluorine-doped tin oxide, antimony-doped tin oxide and aluminum-doped zinc oxide could be used, preferably with sheet resistances in the range of 10 to 20 ohms per square. Other polymer electrolytes, for example comprising hydrogen uranyl phosphate or polyethylene oxide/$LiClO_4$, may also be employed, as well as polymer adhesive layers comprising inorganic films such as $LiNbO_3$, $LiBO_3$, $LiTaO_3$, LiF, $Ta_2O_5$, $Na_3AlF_6$, $Sb_2O_5 \cdot nH_2O + Sb_2O_3$, $Na_2O \cdot 11Al_2O_3$, $MgF_2$, $ZrO_2$, $Nb_2O_5$ and $Al_2O_3$. In addition to tungsten oxide, $WO_3$, other cathodically coloring materials such as $MoO_3$, $V_2O_5$, $Nb_2O_5$, $TiO_2$, $Cr_2O_3$, $RuO_2$ and $PrO_2$, may be compatible with the other components of the electrochromic device of the present invention, as well as ternary metal oxides and tungsten bronzes, such as $MoWO_3$, $NbWO_3$, $K_{1-x}WO_3$ and $Na_{1-x}WO_3$, where x is less than 1. In addition to the preferred iridium oxide, other anodically coloring materials which may be used include NiO, $Fe_4$

[F$_3$(CN)$_6$]$_3$, V$_2$O$_5$, RhO$_3$ and LiCoO$_2$. The counterelectrode may also be passive, instead of complementary, utilizing material such as In$_2$O$_3$, tin-doped indium oxide (ITO) and Nb$_2$O$_5$. Organic electrochromic materials such as polyaniline and viologens (1,1-diheptyl-4,4-bipyridinium dibromide) may also be used in the electrochromic devices of the present invention, the scope of which is defined by the following claims.

We claim:

1. An article of manufacture comprising:
   a. A transparent polymeric substrate;
   b. a primary layer comprising a copolymer of acrylic acid and a substituted acrylate disposed on a surface of said substrate;
   c. an electroconductive metal oxide film deposited on said primer layer; and
   d. an electrochromic film deposited on said electroconductive metal oxide.

2. An article according to claim 1, wherein said polymeric substrate is selected from the group consisting of polycarbonates, polymer prepared from diethylene glycol bis(allyl carbonate) and acrylics.

3. An article according to claim 1, wherein said substrate is a polymer prepared from a monomer selected from the group consisting of diethylene glycol bis(allylcarbonate), bisphenol A and methyl methacrylate.

4. An article according to claim 1, wherein said primer comprises a copolymer of acrylic acid and a comonomer selected from the group consisting of hydroxyethylacrylate, cyanoethylacrylate methyl methacrylate, and mixtures of such acrylates.

5. An article according to claim 4, wherein said primer is a copolymer of acrylic acid and methyl methacrylate in a molar ratio of from about 3:1 to about 1:3.

6. An article according to claim 1, wherein said electroconductive metal oxide film is selected from the group consisting of tin oxide and indium/tin oxide.

7. An article according to claim 6, wherein said electroconductive metal oxide film is indium/tin oxide in a weight ratio of about 90:10 indium:tin.

8. An article of manufacture comprising:
   a. a transparent substrate consisting of the polymerization product of diethylene glycol bis(allyl carbonate);
   b. a primer layer of a copolymer of acrylic acid and a substituted acrylate monomer disposed on a surface of said substrate; and
   c. an electroconductive metal oxide film deposited on said primer layer.

9. An article according to claim 8, wherein said primer layer is a copolymer of acrylic acid and methyl methacrylate.

10. An article according to claim 8, wherein said electroconductive film is indium/tin oxide.

* * * * *